United States Patent [19]

Maute

[11] 3,758,785

[45] Sept. 11, 1973

[54] KEY OPERATED OPTICAL SWITCH FOR ELECTRONICS INPUT KEYBOARD INCLUDING SEMICONDUCTOR LIGHT EMITTING AND LIGHT SENSITIVE COMPONENTS AND RECIPROCATING SHUTTER

[75] Inventor: Hans-Jurgen Maute, Heilbronn-Bocklingen, Germany

[73] Assignee: Licentia Patent-Vernaltungs GmbH, Frankfurt am Main, Germany

[22] Filed: Sept. 13, 1971

[21] Appl. No.: 180,053

[30] Foreign Application Priority Data

Sept. 30, 1970 Germany .................. P 20 47 997.4

[52] U.S. Cl. .............. 250/229, 250/239, 340/365 P

[51] Int. Cl. ........................... H01j 1/56, G01d 5/34

[58] Field of Search ....................... 200/DIG. 1, 181, 200/11 TW; 335/205; 250/217 R, 217 SS, 219 R, 219 D, 219 DD, 229, 230, 231 R, 239; 340/365 P

[56] References Cited

UNITED STATES PATENTS

| | | | |
|---|---|---|---|
| 2,641,753 | 6/1953 | Oliwa | 250/229 UX |
| 3,465,099 | 9/1969 | Harris | 340/365 P X |
| 3,668,407 | 6/1972 | Matzen et al. | 250/229 |
| 3,598,933 | 8/1971 | Walser | 200/11 TW |
| 3,419,697 | 12/1968 | Gove | 200/181 |
| 3,244,847 | 4/1966 | Erpel | 200/172 R X |

*Primary Examiner*—J. R. Scott
*Attorney*—George H. Spencer et al.

[57] ABSTRACT

A key device for an electronic input keyboard including a key head mounted in a housing so as to be displaceable therein between two positions, a light emitting element, a light sensitive element energized by a light beam from the light emitting element, both mounted in the housing, and a light interrupting element associated with the key head for interrupting the light beam in one of the two positions of the key head.

12 Claims, 3 Drawing Figures

KEY OPERATED OPTICAL SWITCH FOR ELECTRONICS INPUT KEYBOARD INCLUDING SEMICONDUCTOR LIGHT EMITTING AND LIGHT SENSITIVE COMPONENTS AND RECIPROCATING SHUTTER

BACKGROUND OF THE INVENTION

The invention relates to a key device for an electronic input keyboard for installations which print out, process or store data, such as for example electronic typewriters and calculators, teleprinters, systems storing and processing instructions on machines with suitable input units, instruction stores in lifts, and the like.

Known input keyboards operate mechanically by means of lever arms or by closing a direct electrical contact by depressing a key.

SUMMARY OF THE INVENTION

It is an object of the present invention to provide a simple input keyboard which can be easily exchanged, and which eliminates contacts of the direct electrical type.

It is a related object of the invention to provide a simple key device which can be easily exchanged with other key devices in a keyboard, which device obviates the necessity for movable electric contacts.

According to the invention, there is provided a key device for an electronic input keyboard comprising a key housing including a cavity portion and a base portion extending into the cavity portion, a key head mounted in the cavity portion so as to be vertically displaceable relative to the base portion between an operative position and an inoperative position, a light emitting element in the base portion, a light sensitive element also mounted in the base portion and arranged to be energized by a light beam from the light emitting element, and a light interrupting element associated with the key head for interrupting the light beam in one of the operative and inoperative positions of the key head.

BRIEF DESCRIPTION OF THE DRAWINGS

The invention will now be described in greater detail, by way of example, with reference to the drawings, in which.

DESCRIPTION OF THE PREFERRED EMBODIMENT

Figure 1:
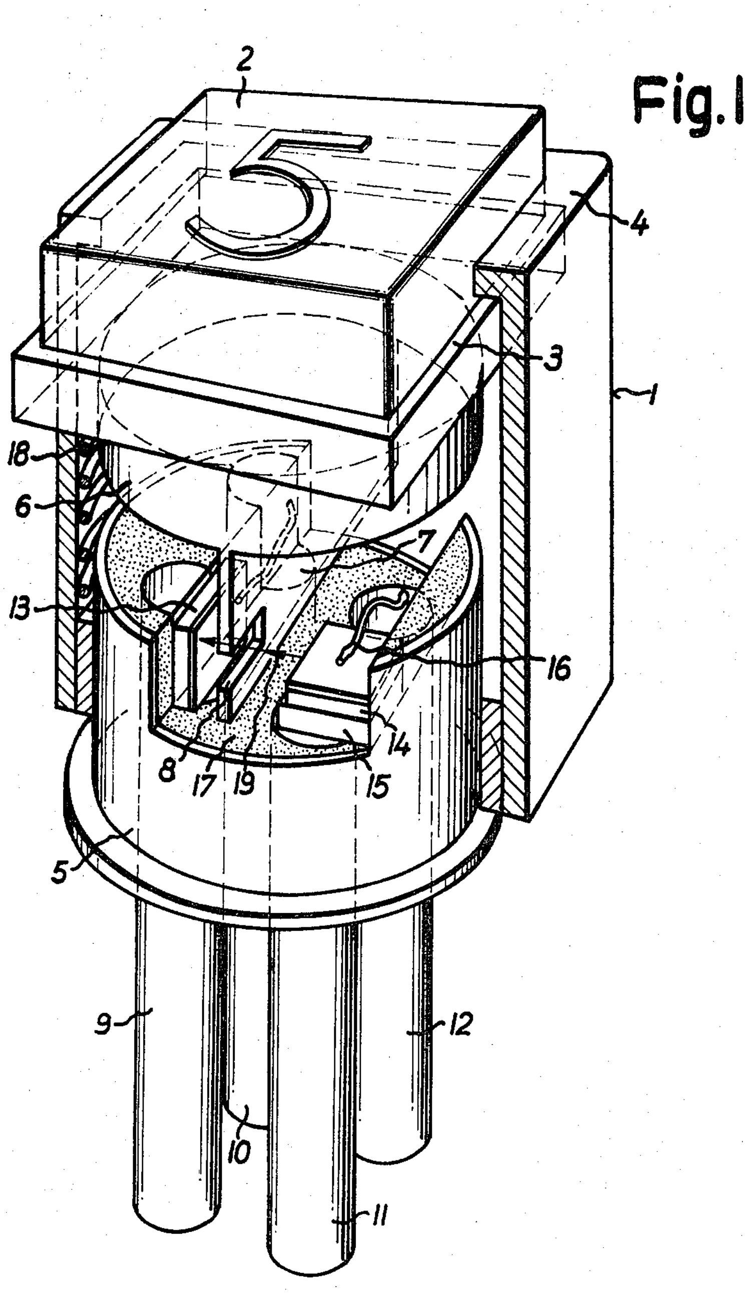
FIG. 1 shows, partly in perspective and partly in cross-section, a key device in accordance with the invention.

The invention proposes that a key housing should contain a vertically displaceable key head, a light emitting semiconductor element, a light sensitive semiconductor element, means being provided such that the light connection existing between the two semiconductor elements is broken when the key head is actuated, or a light connection is established which is normally broken when the key head is not actuated.

The key device for the input keyboard, according to the invention has the advantage of no longer requiring any mechanically moving lever arms. The arrangement of the invention also eliminates direct electrical contacts which are known to have only a limited useful life owing to the burning off and mechanical wear of contacts. Another essential advantage of the new key device is that the keys can be fitted into plug-in bars so that they can be simply exchanged or replaced. The keys constructed according to the invention are preferably connected with correspondingly electrically connected bars by plugs and have no further mechanical or electrical connection with the input device.

It may be mentioned as a further advantage that the keys may be manufactured independently of the other parts of the machines, and fitted in the positions provided therefor after the assembly of the machine. The keys are already equipped with the necessary means for opening and closing the circuit without physical contacts so that their manufacture may be carried out by mass production methods, using the experience and the devices gained in the manufacture and in the assembly of semiconductors.

According to a preferred further feature of the key device according to the invention, the head of the key consists of a step-shaped plate, guided in a cavity of the housing, the edge of the housing being provided with an inner shoulder engageable with the step of the key head, so that the inoperative position of the key head is defined when contact between the housing edge and the step in the key head is achieved. To this end, the housing comprises a spring which urges the key head in the inoperative position against the inner shoulder flange of the housing edge.

The key head comprises preferably a shutter which, during the displacement of the key head, either establishes a light path between the two semiconductor elements, or interrupts the light path which exists when the key head is in its inoperative position.

In a preferred embodiment, this shutter consists, for example, of a plate which is mounted on the head and extends vertically into the interior of the housing. The plate is located in the space in the housing between the two semiconductor elements which are arranged to face each other.

The dimensions of the shutter plate which is displaced together with the key head in the vertical direction may, for example, be chosen in such a way that the lower plate edge terminates immediately above the preferably horizontally extending light path between the two semiconductor elements.

In another preferred embodiment, the shutter plate has an opening or a recess through which the light path between the two semiconductor elements is established either in the inoperative position, or when the key is depressed. In the other position of the key, the path of the light is interrupted by the solid portion of the shutter plate located outside the opening or recess.

Referring now to the drawings FIG. 1 shows, partly in perspective and partly in cross-section an input key according to the invention.

The key head consists of a plate 2 which includes a step portion 3 forming the bottom portion thereof. The step portion 3 serves as a limit stop, cooperating with a flanged inwardly extending edge 4 of a housing cavity portion 1. This housing forms the guide for the key head 2 which is vertically displaceable. Inside the housing there is a spring 18 which urges the key 2 with the step 3 against the edge 4 of the housing cavity portion 1, and ensures the return of the key into the inoperative position after it has been depressed.

A base portion 5 may be pushed, for example, from the bottom into the housing cavity portion 1, such as, for example, a base for transistors or other semiconductor elements, such as used in semiconductor engineering. The socket, for example, consists of an insulating block 17 surrounded by a metal cylinder. Electrode leads 9 to 12 extend through the insulating block, and form preferably plugs on the side remote from the housing. This enables the key assembly with its electrical part to be fitted into corresponding sockets of a terminal bar (not shown) in order to connect it electrically with the keyboard.

Figure 2:
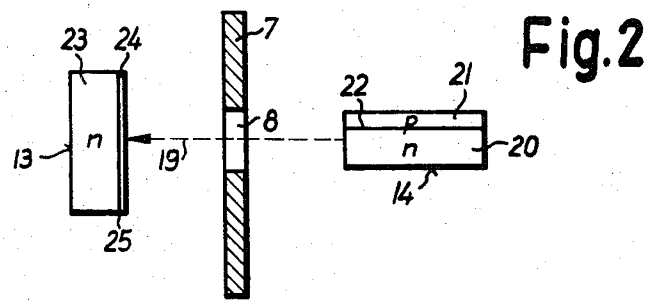
FIG. 2 shows, diagrammatically, the operative parts of the device of FIG. 1.

One electrode lead 9 carries, for example, a semiconductor element 13 which is sensitive to incident light. This element comprises preferably two separate regions divided from each other by a p-n junction. The semiconductor elements are shown separately in FIG.2. The two semiconductor regions of the element 13 are indicated by the reference numerals 23 and 24, the p-n junction by the reference numeral 25.

The region 23 is connected mechanically and electrically with the electrode lead 9 (FIG.1), whilst the thin surface region 24 is connected electrically by a contacting wire to the electrode lead 10. In a like manner, the part of the base surface facing the element 13 carries the light emissive semiconductor element, connected to the electrode lead 11. A plate 15 may be fitted between the semiconductor body and the contact surface of the electrode lead. According to FIG.2 also this element has two separate semiconductor regions 20 and 21 divided by a p-n junction 22. A light beam 19 is transmitted from the p-n junction when a suitable voltage is applied to a semiconductor regions, and passes, for example, through opening 8 in the shutter plate 7 to the semiconductor element 13, where it causes a current to flow.

Also in this second semiconductor element, the zone not connected with the electrode lead 11 is connected electrically by a thin wire 16 with a further lead 12 serving as an electrode lead.

In the embodiment shown in FIG.1, the base of the, for example, rectangular key head carries a round disc 6 with the shutter plate 7 extending vertically into the interior of the housing and arranged between the two semiconductor elements 13 and 14 to form a partition. This partition, which is vertically displaced together with the key head when the key is operated, has the opening or recess 8 located in the region of the light path 19 so that a light connection is established between the two semiconductor elements when the key is at rest.

When the key is operated, this recess is displaced and breaks the light path between the two semiconductor elements.

The travel of the key necessary for interrupting the light path may be chosen as small as desired by making the recess very narrow, or by making the distance between the light path and the upper edge of the recess very small.

However, it should again be stressed that the recess may also be so arranged that the light path is established through the recess only when the key is operated.

Preferably, the depth of travel of the key is limited. This may be achieved by the distance between the lower edge of the plate 7 and the surface of the base 5, or by a recess in the inner wall of the housing cavity portion 1.

To enable the amount of depression to be adjusted, means are preferably provided whereby the relative position between the light path 19 and the shutter plate 7 may be varied. This may be achieved, for example, in that the housing base portion 5 is displaceable in the housing cavity portion 1.

It is also possible to improve the focusing of the light beam between the two semiconductor elements by an optical arrangement in the shutter plate. This may be, for example, a cylindrical lens.

Figure 3:
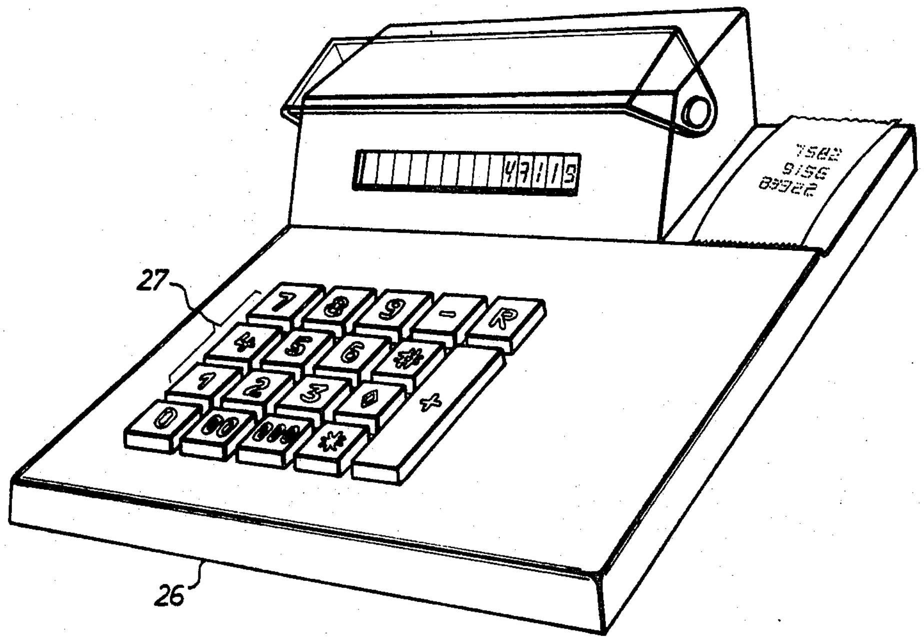
FIG. 3 shows, in perspective view, an input keyboard in which the key device of the invention can be used.

FIG.3 shows, by way of example, the keyboard of a desk calculator 26 which does not differ in its external appearance from known keyboards. However, the keys 27 are keys fitted into a plug-in plate according to FIG.1, which can be exchanged against other keys if necessary. To this end, the key 27 need only be removed from the plug-in plate and a new key be inserted.

The keyboard constructed with devices according to the invention, may be used to advantage wherever data are to be further processed electrically, either for printing out data, for purposes of storing, or for evaluating control instructions. The keyboard according to the invention represents a further step on the way to the fully electronic construction of electrical installations which may be economically produced and maintained.

It will be understod that the above description of the present invention is susceptible to various modifications changes and adaptations.

What is claimed is:

1. A key device for an electronic input keyboard, comprising: a housing including a cavity portion and a base portion extending into said cavity portion; a key head mounted in said cavity portion so as to be substantially vertically displaceable relative to said base portion between an operative position and an inoperative position; a plurality of electrode leads extending outwardly in a substantially vertical direction from said cavity portion and away from said key head; means mounted in said cavity portion and between said key head and said base portion for normally urging said key head into its said inoperative position; a light emitting semiconductor element mounted on said base portion and electrically connected to certain of said electrode leads; a light sensitive semiconductor element mounted on said base portion and electrically connected to others of said electrode leads, said light sensitive semiconductor being arranged to be energized by a light beam from said light emitting semiconductor element; and means connected with said key head for movement therewith for interrupting said light beam when said key head is in only one of its said positions.

2. A key device as defined in claim 1, wherein said key head is formed as a stepped member including a step portion and said cavity portion is provided with an internal flange, and wherein engagement of the step portion of said key head with said internal flange defines said inoperative position.

3. A key device as defined in claim 2, wherein said means for normally urging said key head into said inoperative position is a spring.

4. A key device as defined in claim 1, wherein said interrupting means comprises a shutter plate mounted on said key head for movement, in response to movement of said key head, between said light emitting semiconductor element and said light sensitive semiconductor element and from an inoperative position adjacent said light beam to an operative position in which it interrupts said light beam.

5. A key device as defined in claim 1, wherein said interrupting means comprises a shutter plate mounted on said key head for movement therewith, said shutter plate extending between said light emitting semiconductor element and said light sensitive semiconductor element.

6. A key device as defined in claim 5, wherein said shutter plate defines an aperture or recess which is located when said key head is in said inoperative position to pass said light beam and which is located when said key head is in said operative position to interrupt the passage of said light beam.

7. A key device as defined in claim 5, wherein said shutter plate defines an aperture or recess which is located when said key head is in said operative position to pass said light beam and which is located when said key head is in said inoperative position to interrupt the passage of said light beam.

8. A key device as defined in claim 5 wherein said shutter plate defines an aperture or recess through which said light beam passes in only one of said positions of said key head, and the device further comprising optical means arranged in said aperture or recess.

9. A key device as defined in claim 5, further comprising means for adjusting the length of travel of said key head and means for adjusting the relative position between said light beam and said shutter plate.

10. A key device as defined in claim 1, wherein said base portion includes a socket, and wherein said semiconductor elements are mounted on said socket and said electrode leads pass through said socket in an insulated manner.

11. A key device as defined in claim 10, wherein said base portion is displaceably mounted in said cavity portion.

12. A key device as defined in claim 10, wherein said electrode leads passing through said base portion comprise plug members on the outer side of said base portion.

* * * * *

UNITED STATES PATENT OFFICE
CERTIFICATE OF CORRECTION

Patent No. 3,758,785 Dated September 11th, 1973

Inventor(s) Hans-Jürgen Maute

It is certified that error appears in the above-identified patent and that said Letters Patent are hereby corrected as shown below:

In the heading of the patent, line 9, change "Vernaltungs" to --Verwaltungs--. Column 2, line 37, after "and" insert --which--. Column 3, line 34, after "to" change "a" to --the--; line 35, after "in" change "the" to --a--.

Signed and sealed this 26th day of March 1974.

(SEAL)
Attest:

EDWARD M.FLETCHER,JR.
Attesting Officer

C. MARSHALL DANN
Commissioner of Patents

:M PO-1050 (10-69)

USCOMM-DC 60376-P69
☆ U.S. GOVERNMENT PRINTING OFFICE : 1969 O—366-334.